(12) United States Patent
Cui

(10) Patent No.: US 9,482,409 B2
(45) Date of Patent: Nov. 1, 2016

(54) LIGHTING DEVICE, BACKLIGHTING FOR A DISPLAY OR A TELEVISION, AND DISPLAY OR TELEVISION

(71) Applicant: OSRAM Opto Semiconductors GmbH, Regensburg (DE)

(72) Inventor: Hailing Cui, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/431,731

(22) PCT Filed: Aug. 29, 2013

(86) PCT No.: PCT/EP2013/067908
§ 371 (c)(1),
(2) Date: Mar. 26, 2015

(87) PCT Pub. No.: WO2014/048669
PCT Pub. Date: Apr. 3, 2014

(65) Prior Publication Data
US 2015/0241026 A1    Aug. 27, 2015

(30) Foreign Application Priority Data

Sep. 26, 2012 (DE) ........................ 10 2012 109 104

(51) Int. Cl.
| | |
|---|---|
| H05B 33/14 | (2006.01) |
| F21V 9/16 | (2006.01) |
| G02F 1/1335 | (2006.01) |
| H01L 33/50 | (2010.01) |
| F21K 99/00 | (2016.01) |
| F21V 9/08 | (2006.01) |
| H04N 9/31 | (2006.01) |

(52) U.S. Cl.
CPC . *F21V 9/16* (2013.01); *F21K 9/56* (2013.01); *F21V 9/08* (2013.01); *G02F 1/133603* (2013.01); *H01L 33/50* (2013.01); *H04N 9/3117* (2013.01); *G02F 2001/133614* (2013.01); *G02F 2001/133624* (2013.01)

(58) Field of Classification Search
CPC ............. F21V 9/16; F21V 9/08; F21K 9/56; H04N 9/3117; G02F 1/133603; G02F 2001/133614; G02F 2001/133624; H01L 33/50
See application file for complete search history.

(56) References Cited

U.S. PATENT DOCUMENTS

| | | | |
|---|---|---|---|
| 6,513,949 B1 | 2/2003 | Marshall et al. | |
| 7,256,557 B2 | 8/2007 | Lim et al. | |
| 7,821,196 B2 | 10/2010 | Bokor et al. | |
| 2007/0182887 A1* | 8/2007 | Haga | G02F 1/133603 349/106 |
| 2010/0091215 A1 | 4/2010 | Fukunaga et al. | |
| 2010/0201250 A1 | 8/2010 | Winkler et al. | |
| 2010/0201919 A1 | 8/2010 | Kamada | |
| 2010/0289044 A1 | 11/2010 | Krames et al. | |
| 2011/0222277 A1* | 9/2011 | Negley | H01L 33/504 362/235 |
| 2011/0241044 A1 | 10/2011 | Jang et al. | |
| 2012/0119640 A1* | 5/2012 | Nishioka | F21K 9/00 313/498 |
| 2012/0161170 A1* | 6/2012 | Dubuc | A01G 7/045 257/89 |
| 2012/0274878 A1 | 11/2012 | Kunz et al. | |
| 2013/0188334 A1 | 7/2013 | Berben et al. | |

FOREIGN PATENT DOCUMENTS

| | | |
|---|---|---|
| DE | 10036940 A1 | 2/2002 |
| DE | 102006030890 A1 | 5/2007 |
| DE | 102007016229 A1 | 10/2008 |
| DE | 102010012423 A1 | 6/2011 |
| DE | 102010041420 A1 | 3/2012 |
| DE | 102011104302 A1 | 12/2012 |
| EP | 0216359 A2 | 4/1987 |
| EP | 2135920 A1 | 12/2009 |
| EP | 2163594 A2 | 3/2010 |
| WO | 2012038235 A1 | 3/2012 |

\* cited by examiner

*Primary Examiner* — Donald Raleigh
(74) *Attorney, Agent, or Firm* — Slater Matsil, LLP

(57) ABSTRACT

A lighting device includes a first semiconductor body, which has an active zone that produces blue light having a first emission spectrum during operation, and a second semiconductor body, which has an active zone that produces green light having a second emission spectrum during operation. The lighting device also comprises a luminescent substance that is suitable for converting blue light of the first semiconductor body partially into red light having a third emission spectrum. The third emission spectrum has a peak in the red spectral range, the average half-width of which is no greater than 25 nm. The invention further relates to a backlighting device for a display or a television and to a display and a television.

14 Claims, 6 Drawing Sheets

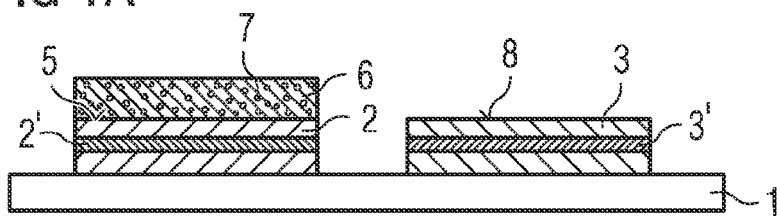
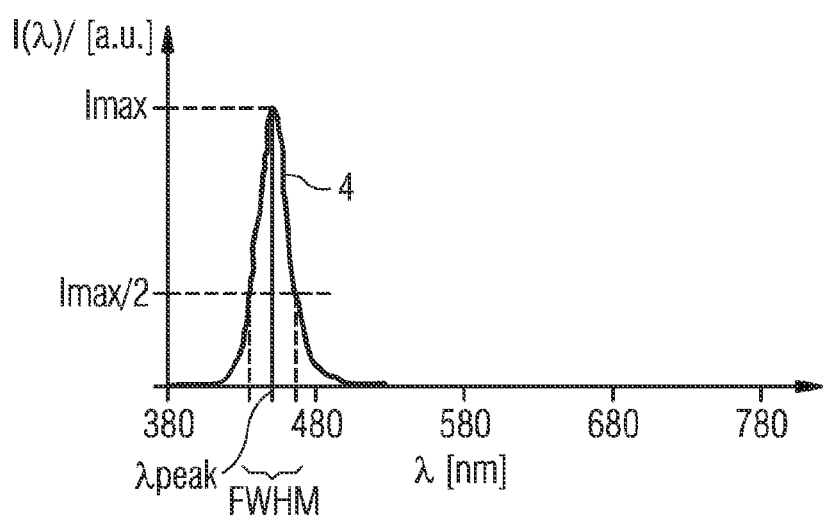
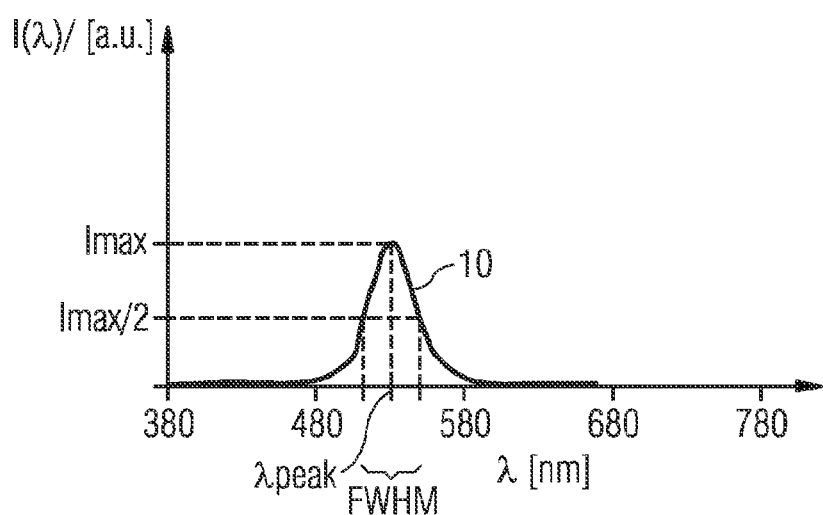

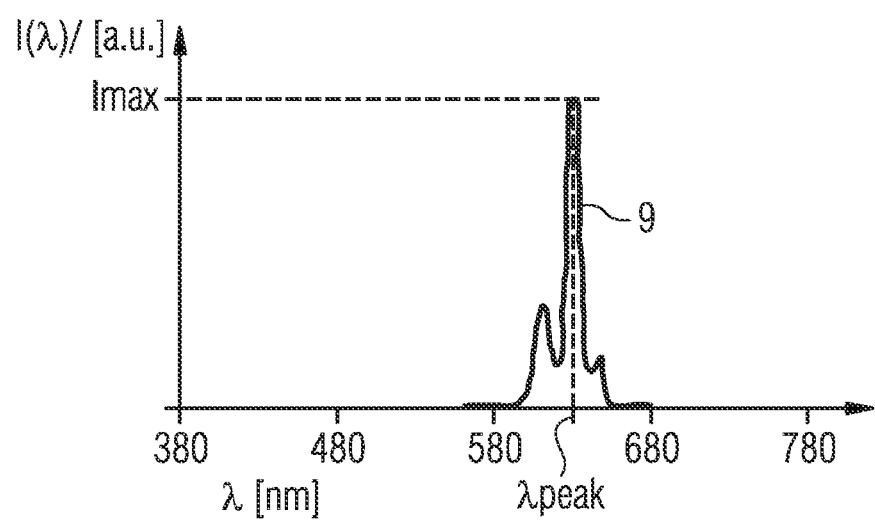
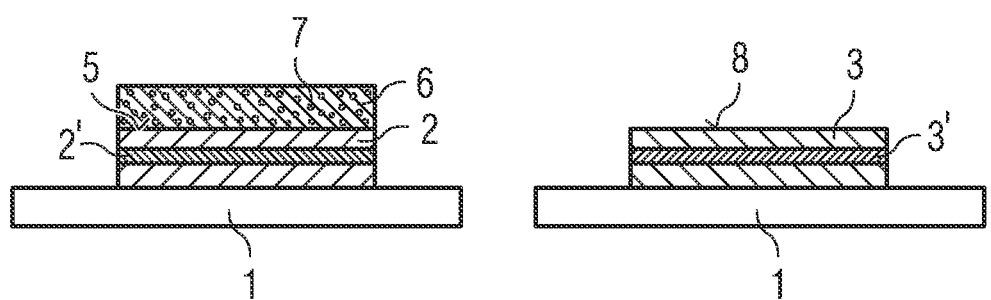

LIGHTING DEVICE, BACKLIGHTING FOR A DISPLAY OR A TELEVISION, AND DISPLAY OR TELEVISION

This patent application is a national phase filing under section 371 of PCT/EP2013/067908, filed Aug. 29, 2013, which claims the priority of German patent application 10 2012 109 104.8, filed Sep. 26, 2012, each of which is incorporated herein by reference in its entirety.

TECHNICAL FIELD

A lighting device and a backlighting, in particular for a display or a television, are specified. Furthermore, a display and a television are specified.

BACKGROUND

A lighting device is disclosed for example in German patent publication DE 10 2011 104 302 and U.S. Pat. No. 6,513,949.

SUMMARY

Embodiments of the present application to specify a lighting device whose light can be used to span the largest possible color triangle in the CIE chromaticity diagram. In particular, the intention is to specify a lighting device which is suitable for use in a television or as backlighting for a display, and a display or a television comprising such a lighting device.

A lighting device comprises in particular a first semiconductor body, which has an active zone that generates blue light having a first emission spectrum during operation, and a second semiconductor body, which has an active zone that generates green light having a second emission spectrum during operation. Furthermore, the lighting device comprises a phosphor suitable for converting blue light of the first semiconductor body partly into red light having a third emission spectrum. Particularly preferably, a peak of the third emission spectrum has an average full width half maximum (FWHM) that is not greater than 25 nm. In accordance with one embodiment, the third emission spectrum has a single peak lying in the red spectral range.

Particularly preferably, a peak of the third emission spectrum has an average full width half maximum that is not greater than 20 nm.

If the third emission spectrum of the phosphor has a plurality of peaks, then particularly preferably that peak of the third emission spectrum which has the greatest intensity has an average full width half maximum that is not greater than 25 nm, preferably not greater than 20 nm. The peak of the third emission spectrum having the greatest intensity generally lies in the red spectral range and determines the color impression of the red light which arises for a human observer.

In the present case, the average full width half maximum (FWHM) of a peak of an emission spectrum is understood to mean the width of the peak at which half of the intensity maximum is attained.

A central concept in the present case is that of using a red phosphor having the narrowest possible line width for converting blue, primary light in order to span the largest possible color triangle within the CIE chromaticity diagram. In contrast to a combination of a red light emitting diode, a green light emitting diode and a blue light emitting diode, which combination can likewise be used for generating white light, the lighting device described here advantageously has light having a higher color brilliance and a color locus having higher thermal stability. Furthermore, the lighting device described here can advantageously be driven more simply.

Particularly preferably, the phosphor comprises manganese ions, europium ions or samarium ions as activator. The europium ions and the samarium ions are generally trivalent ions, that is to say $Eu^{3+}$ and $Sm^{3+}$.

By way of example, europium-doped molybdenum-containing or europium-doped tungsten-containing phosphors, such as $CaWO_4:Eu^{3+}$, for instance, are suitable as phosphor.

Furthermore, samarium-doped molybdenum-containing phosphors, such as $Gd_2(MoO_4)_3:Sm^{3+}$, for instance, or samarium-doped tungsten-containing phosphors can also be used as phosphor.

In particular, manganese-doped phosphors that comply with the following formula are suitable for the lighting device: $K_2MF_6:Mn^{4+}$, where M=Ti, Si, Ge.

These phosphors preferably convert blue light and ultraviolet light into red radiation.

In accordance with one preferred embodiment of the lighting device, a peak of the first emission spectrum of the blue light has an average full width half maximum that is not greater than 30 nm. In accordance with one embodiment, the first emission spectrum has a single peak lying in the blue spectral range.

If the emission spectrum of the blue light of the first semiconductor body has a plurality of peaks, then particularly preferably that peak of the emission spectrum of the blue light of the first semiconductor body which has the greatest intensity has an average full width half maximum that is not greater than 30 nm.

Particularly preferably, the first emission spectrum of the blue light has a peak wavelength of between 435 nm and 460 nm inclusive. If the first emission spectrum has only a single peak, then the latter lies in the blue spectral range. If the first emission spectrum of the blue light has a plurality of peaks, then particularly preferably that peak of the first emission spectrum which has the greatest intensity has a peak wavelength of between 435 nm and 460 nm inclusive. That peak of the first emission spectrum which has the greatest intensity generally lies in the blue spectral range and determines the color impression of the blue light that arises for a human observer.

In the present case, "peak wavelength" denotes that wavelength of a peak at which the peak has the maximum intensity.

Particularly preferably, the phosphor is suitable for converting light having a wavelength from the full width half maximum of the greatest peak of the first emission spectrum into red light having the third emission spectrum.

A semiconductor body that emits blue light is particularly preferably based on a nitride compound semiconductor material or a phosphide compound semiconductor material.

Nitride compound semiconductor materials are compound semiconductor materials from the system $In_xAl_yGa_{1-x-y}N$ where $0 \leq x \leq 1$, $0 \leq y \leq 1$ and $x+y \leq 1$. Phosphide compound semiconductor materials are compound semiconductor materials from the system $In_xAl_yGa_{1-x-y}P$ where $0 \leq x \leq 1$, $0 \leq y \leq 1$ and $x+y \leq 1$.

Particularly preferably, the second emission spectrum of the green light has a peak having an average full width half maximum that is not greater than 40 nm. If the second emission spectrum has a plurality of peaks, then particularly preferably that peak of the second emission spectrum which has the greatest intensity has an average full width half maximum that is not greater than 40 nm.

Furthermore, the emission spectrum of the green light of the second semiconductor body preferably has a peak having a peak wavelength of between 515 nm and 560 nm inclusive. In accordance with one embodiment, the second emission spectrum has a single peak lying in the green spectral range.

If the emission spectrum of the green light of the second semiconductor body has a plurality of peaks, then particularly preferably that peak of the emission spectrum of the green light which has the greatest intensity has a peak wavelength of between 515 nm and 560 nm inclusive and generally determines the color impression of the green light that arises for a human observer.

The third emission spectrum of the red light furthermore preferably has a peak wavelength of between 595 nm and 650 nm inclusive. In accordance with one embodiment, the third emission spectrum of the phosphor has only a single peak lying in the red spectral range.

If the third emission spectrum of the phosphor has a plurality of peaks, then particularly preferably that peak of the third emission spectrum which has the greatest intensity has a peak wavelength of between 595 nm and 650 nm inclusive. This peak generally lies in the red spectral range and determines the color impression brought about by the red light for a human observer.

In accordance with one embodiment of the lighting device, the first semiconductor body and the second semiconductor body are arranged in a common housing or on a common carrier. Such a lighting device is a light emitting diode, for example.

Alternatively, it is also possible for the first semiconductor body and the second semiconductor body to be arranged in two separate housings or on two separate carriers. Such a lighting device is a light emitting diode module, for example.

In accordance with a further embodiment of the lighting device, the phosphor is comprised by a wavelength-converting layer. The wavelength-converting layer comprising the phosphor is applied for example on the radiation exit surface of the first semiconductor body. By way of example, the wavelength-converting layer is arranged in direct contact with the radiation exit surface of the first semiconductor body.

The wavelength-converting layer can be produced for example by means of sedimentation, electrophoretic deposition or by means of a layer transferring method.

In the case of electrophoretic deposition, particles of the phosphor and the surface to be coated are introduced into an electrophoresis bath. The particles of the phosphor are then accelerated by means of an electric field such that a wavelength-converting layer of the particles is deposited on the surface provided.

One characteristic of a wavelength-converting layer deposited by means of electrophoresis is that generally at least all the electrically conductive surfaces exposed to the electrophoresis bath are completely coated with the wavelength-converting layer.

In general, the structure of an electrophoretically deposited wavelength-converting layer is furthermore dependent on the conductivity of the surface on which the wavelength-converting layer is applied. In general, the particles of an electrophoretically deposited wavelength-converting layer are in direct contact with one another.

In general, an electrophoretically deposited wavelength-converting layer is fixed by a binder after the electrophoresis method. The binder can for example contain one of the following materials or be formed from one of the following materials: epoxide, silicone, spin-on glass.

In the case of a sedimentation method, particles of the phosphor are introduced into a potting material. The radiation exit surface of the semiconductor body is provided for example in the cutout of a component housing, said cutout being filled with the potting material, a dilute potting material or some other liquid that comprises the phosphor particles to be deposited. The particles of the wavelength conversion substance subsequently sediment in the form of a wavelength-converting layer at least on the radiation exit surface of the semiconductor body on account of the gravitational force. In this case, the sedimenting of the particles can also be accelerated by centrifuging. The use of a dilute potting material also accelerates the sedimentation process in general. After the particles have settled, the potting material is generally cured.

Furthermore, for applying a wavelength-converting layer by means of sedimentation, it is also possible to apply the semiconductor body on a carrier, which is then surrounded with an auxiliary cavity into which the potting material with the phosphor is introduced. After the phosphor particles have settled, the potting material is cured and the auxiliary cavity is removed again.

One characteristic of a wavelength-converting layer that was applied by means of a sedimentation method is that all surfaces on which the particles can sediment on account of the gravitational force are coated with the wavelength-converting layer.

In the case of a layer transferring method, the wavelength-converting layer is produced spatially separately from the semiconductor body and then transferred to the radiation exit surface thereof. By way of example, the wavelength-converting layer can be produced on a film by means of a printing method—for instance screen printing—and can then be positioned on the radiation exit surface of the semiconductor body by means of a pick-and-place method.

If the first semiconductor body and the second semiconductor body are arranged in the cutout of a component housing, then the phosphor can for example also be encompassed by a potting material in the cutout.

By way of example, a silicone or an epoxide or a mixture of these materials can be used as potting material. In this case, the first semiconductor body and the second semiconductor body can be encompassed by separate component housings or by a common component housing.

In accordance with a further embodiment, the phosphor is arranged in a manner spaced apart from the semiconductor bodies. By way of example, the phosphor can be arranged as a dome-shaped layer in a manner spaced apart above the semiconductor bodies.

Furthermore, it is also possible for the phosphor to be arranged as a film in a manner spaced apart above the semiconductor bodies. In this case, the film can be formed for example from a matrix material, such as polycarbonate, silicone or epoxide, into which particles of the phosphor are introduced.

The lighting device is suitable in particular as backlighting for a display or as a lighting device for a television.

A display or a television preferably comprises a lighting device described here and a color filter system. The color filter system generally serves to form the subpixels of the display or of the television, wherein the subpixels emit light of the colors blue, green and red. The light source for the individual subpixels in this case forms the lighting device. In other words, the entire light emitted by the first semiconductor body, the second semiconductor body and the phosphor passes through the color filter system. The entire electromagnetic radiation that passes through the filter system comprises electromagnetic radiation having the first emission spectrum, electromagnetic radiation having the second emission spectrum and electromagnetic radiation having the third emission spectrum. The entire electromagnetic radiation has a total spectrum. The total spectrum comprises the first emission spectrum, the second emission spectrum and the third emission spectrum or is formed from the first emission spectrum, the second emission spectrum and the third emission spectrum.

The color filter system preferably has a blue filter, which filters the light of the total spectrum to form light of a first transmission spectrum. Furthermore, the color filter system preferably has a green filter, which filters the light of the total spectrum to form light of a second transmission spectrum. Finally, the color filter system preferably has a red filter, which filters the light of the total spectrum to form light of a third transmission spectrum.

A peak of the first transmission spectrum preferably has an average full width half maximum that is not greater than 30 nm. Preferably, the first transmission spectrum has a single peak lying in the blue spectral range.

If the first transmission spectrum of the filter system has a plurality of peaks, then particularly preferably that peak of the first transmission spectrum which has the greatest intensity has an average full width half maximum that is not greater than 30 nm.

Particularly preferably, the first transmission spectrum has a peak wavelength of between 430 nm and 460 nm inclusive. If the first transmission spectrum has only a single peak, then the latter lies in the blue spectral range. If the first transmission spectrum has a plurality of peaks, then particularly preferably that peak of the first transmission spectrum which has the greatest intensity has a peak wavelength of between 430 nm and 460 nm inclusive. That peak of the first transmission spectrum which has the greatest intensity generally lies in the blue spectral range and determines the color impression of the blue light that arises for a human observer.

A peak of the second transmission spectrum preferably has an average full width half maximum that is not greater than 40 nm. Preferably, the second transmission spectrum has a single peak lying in the green spectral range.

If the second transmission spectrum of the filter system has a plurality of peaks, then particularly preferably that peak of the second transmission spectrum which has the greatest intensity has an average full width half maximum that is not greater than 40 nm.

Particularly preferably, the second transmission spectrum has a peak wavelength of between 515 nm and 560 nm inclusive. If the second transmission spectrum has only a single peak, then the latter lies in the green spectral range. If the second transmission spectrum has a plurality of peaks, then particularly preferably that peak of the second transmission spectrum which has the greatest intensity has a peak wavelength of between 515 nm and 560 nm inclusive. That peak of the second transmission spectrum which has the greatest intensity generally lies in the green spectral range and determines the color impression of the green light that arises for a human observer.

A peak of the third transmission spectrum preferably has an average full width half maximum that is not greater than 25 nm, particularly preferably not greater than 20 nm. Preferably, the third transmission spectrum has a single peak lying in the red spectral range.

If the third transmission spectrum of the filter system has a plurality of peaks, then particularly preferably that peak of the third transmission spectrum which has the greatest intensity has an average full width half maximum that is not greater than 25 nm and particularly preferably not greater than 20 nm.

Particularly preferably, the third transmission spectrum has a peak wavelength of between 595 nm and 650 nm inclusive. If the third transmission spectrum has only a single peak, then the latter lies in the red spectral range. If the third transmission spectrum has a plurality of peaks, then particularly preferably that peak of the third transmission spectrum which has the greatest intensity has a peak wavelength of between 595 nm and 650 nm inclusive. That peak of the third transmission spectrum which has the greatest intensity generally lies in the red spectral range and determines the color impression of the red light that arises for a human observer.

Particularly preferably, a point corresponding to the color impression of the first transmission spectrum in the CIE chromaticity diagram, a point corresponding to the color impression of the second transmission spectrum in the CIE chromaticity diagram and a point corresponding to the color impression of the third transmission spectrum in the CIE chromaticity diagram span a color triangle within the CIE standard diagram that has a degree of overlap of at least 99.5% with the Adobe RGB color triangle. In the present case, Adobe RGB color triangle denotes that triangle within the CIE chromaticity diagram 1931 which is spanned by the following points: (0.640, 0.330), (0.210, 0.710) and (0.150, 0.060).

That color triangle in the CIE chromaticity diagram which is spanned by the three transmission spectra is generally spanned by a blue point in the blue range, by a green point in the green range and by a red point in the red range. In this case, the blue point is generally defined by the peak of the first transmission spectrum having maximum intensity, while the green point is generally defined by the peak of the second transmission spectrum having maximum intensity and the red point by the peak of the third transmission spectrum having maximum intensity.

BRIEF DESCRIPTION OF THE DRAWINGS

Further advantageous embodiments and developments of the invention will become apparent from the exemplary embodiments described below in association with the figures.

FIGS. 1A and 2 to 4 in each case show a schematic sectional illustration of a lighting device in accordance with a respective exemplary embodiment.

FIG. 1B shows a first emission spectrum $I(\lambda)$ of a first semiconductor body in accordance with one exemplary embodiment.

FIG. 1C shows a second emission spectrum $I(\lambda)$ of a second semiconductor body in accordance with one exemplary embodiment.

FIG. 1D shows a third emission spectrum $I(\lambda)$ of a phosphor in accordance with one exemplary embodiment.

Figure 3:
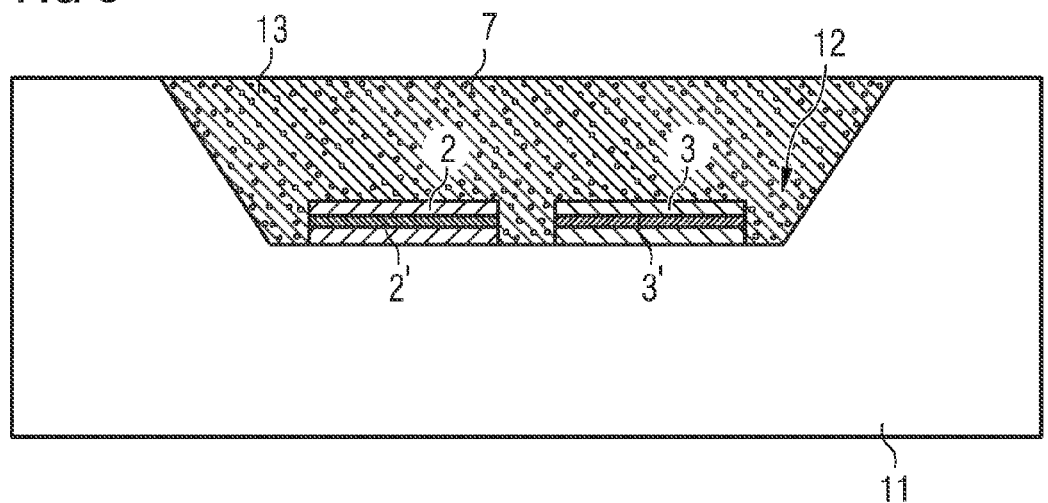

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated size in order to enable better illustration and/or in order to afford a better understanding.

DETAILED DESCRIPTION OF ILLUSTRATIVE EMBODIMENTS

The lighting device in accordance with the exemplary embodiment in FIG. 1A comprises a carrier 1, on which a first semiconductor body 2 and a second semiconductor body 3 are arranged. The first semiconductor body 2 has an active zone 2' that generates blue light having a first emission spectrum 4 during operation. The blue light of the first semiconductor body 2 generated in the active zone 2' is emitted from a radiation exit surface 5 of the first semiconductor body 2. A wavelength-converting layer 6 is arranged on the radiation exit surface 5 of the first semiconductor body 2 and comprises a phosphor 7 suitable for converting blue light of the first semiconductor body 2 partly into red light having a third emission spectrum 9. The second semiconductor body 2 in this case is free of the wavelength-converting layer 6.

The phosphor 7 preferably complies with the following formula: $K_2MF_6:Mn^{4+}$, where M=Ti, Si, Ge. Furthermore, tungsten-containing and molybdenum-containing phosphors doped with europium or samarium, for example, are also suitable for being used in the present lighting device. By way of example, one of the following phosphors can be used: $CaWO_4:Eu^{3+}$; $Gd_2(MoO_4)_3:Sm^{3+}$.

In particular, the third emission spectrum 9 of the phosphor 7 has a peak having an average full width half maximum FWHM that is not greater than 25 nm, preferably not greater than 20 nm.

The blue light of the first semiconductor body 2 in the present case has a first emission spectrum 4 illustrated schematically in FIG. 1B. The first emission spectrum 4 of the blue light has a single peak in the present case. The peak wavelength, that is to say the wavelength $\lambda_{peak}$ at which the peak has the maximum intensity $I_{max}$, is approximately 440 nm in the present case and thus lies in the blue spectral range. The average full width half maximum FWHM of the peak of the first emission spectrum 4, that is to say the width of the peak at which the intensity $I_{max}/2$ is attained, is furthermore not greater than 25 nm.

The second semiconductor body 3 of the lighting device in accordance with the exemplary embodiment in FIG. 1A has an active zone 3' that generates green light having a second emission spectrum 10 during operation. The green light having the second emission spectrum 10 is emitted from the radiation exit surface 8 of the second semiconductor body 3.

The second emission spectrum 10 of the green light is illustrated schematically in FIG. 1C. In the present case, the second emission spectrum 10 has a single peak having an average full width half maximum FWHM that is not greater than 40 nm. The peak wavelength $\lambda_{peak}$ of the peak is approximately 530 nm in the present case and thus lies in the green spectral range.

The third emission spectrum 9 of the phosphor 7 is furthermore shown schematically in FIG. 1D. In the present case, the third emission spectrum 9 has three peaks between a wavelength of approximately 590 nm and approximately 660 nm. The peak having the greatest intensity $I_{max}$ is at a wavelength of approximately 630 nm. The peak wavelength $\lambda_{peak}$ of the third emission spectrum 9 is therefore approximately 630 nm and thus lies in the red spectral range.

In contrast to the exemplary embodiment in FIG. 1, in which the first semiconductor body 2 and the second semiconductor body 3 are applied to a common carrier 1, the lighting device in accordance with the exemplary embodiment in FIG. 2 comprises two separate carriers 1, wherein the first semiconductor body 2 with the wavelength-converting layer 6 is applied to one carrier 1 and the second semiconductor body 3 is applied to the second carrier 1. The second semiconductor body 3 in this case is free of the wavelength-converting layer 6.

The lighting device in accordance with the exemplary embodiment in FIG. 3 comprises a component housing 11 having a cutout 12. The first semiconductor body 2 and the second semiconductor body 3 are arranged in the cutout 12 of the component housing 11. The cutout 12 is filled with a potting 13 comprising the phosphor 7 suitable for converting blue light of the first emission spectrum 4 into red light of the third emission spectrum 9.

Figure 4:
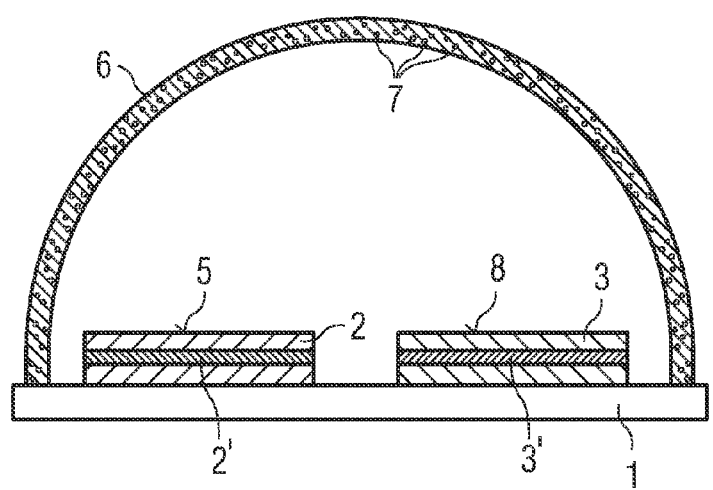

In the case of the lighting device in accordance with the exemplary embodiment in FIG. 4, the first semiconductor body 2 and the second semiconductor body 3 are arranged on a common carrier 1. The phosphor 7 is arranged in a manner spaced apart from the semiconductor bodies 2, 3 in the beam path thereof. The phosphor 7 is comprised by a wavelength-converting layer 6 arranged such that it is curved in a dome-shaped manner above the semiconductor bodies 2, 3.

Figure 5:
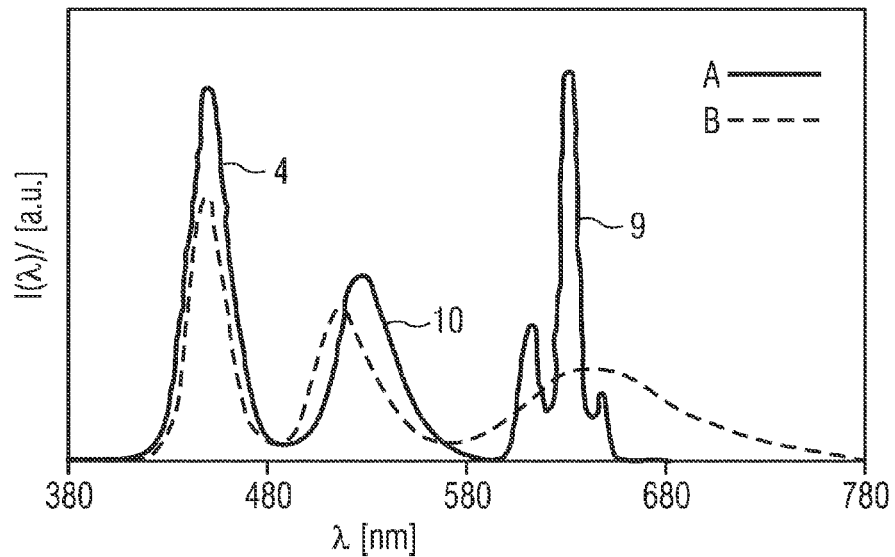
FIG. 5 shows by way of example the total spectrum of a conventional lighting device (curve B, dashed) and the total spectrum of a lighting device in accordance with one exemplary embodiment (curve A, solid).

FIG. 5 schematically shows the total spectra of two different lighting devices. Curve A (solid line) shows the radiation intensity I in arbitrary units as a function of the wavelength $\lambda$ of a lighting device such as has already been described by way of example with reference to FIGS. 1A to 1D. The total spectrum in accordance with curve A comprises a first narrowband peak in the blue wavelength range having a peak wavelength $\lambda_{peak}$ at approximately 440 nm and an average full width half maximum FWHM of approximately 30 nm. This peak originates from the unconverted blue light having the first emission spectrum 4 of the first semiconductor body 2.

Furthermore, the total spectrum in accordance with curve A comprises a second peak in the green wavelength range, which originates from the green light of the second semiconductor body 3 having the second emission spectrum 10.

This second peak has a peak wavelength $\lambda_{peak}$ of approximately 530 nm and an average full width half maximum FWHM of approximately 50 nm.

Furthermore, the total spectrum in accordance with curve A exhibits a narrowband peak in the red spectral range having a peak wavelength $\lambda_{peak}$ of approximately 630 nm and an average full width half maximum FWHM of approximately 25 nm. This peak originates from the third emission spectrum 9 of the phosphor 7.

For comparison purposes, FIG. 5 furthermore shows the total spectrum I as a function of the wavelength λ of a conventional lighting device on the basis of curve B (dashed line). In contrast to the solid curve A showing the total spectrum of a lighting device comprising a phosphor 7 that emits light having an emission spectrum having at least one narrowband red peak, the total spectrum of the conventional lighting device has a very wide peak in the red range of a red phosphor 7. The peak has a peak wavelength $\lambda_{peak}$ of approximately 660 nm and an average full width half maximum FWHM of approximately 100 nm.

Figure 6:
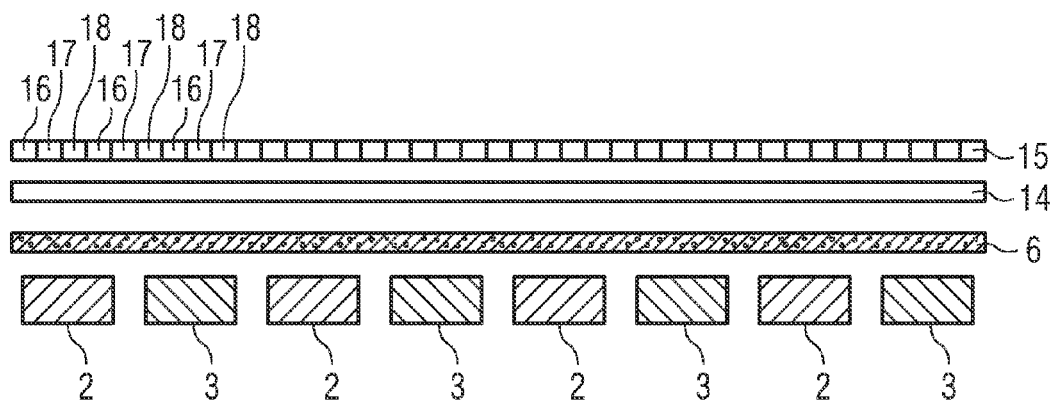
FIG. 6 shows a schematic sectional illustration of a display in accordance with one exemplary embodiment.

The display in accordance with the exemplary embodiment in FIG. 6 comprises a multiplicity of first semiconductor bodies 2 and second semiconductor bodies 3 arranged alternately alongside one another. By way of example, the first semiconductor bodies 2 and the second semiconductor bodies 3 can be arranged on a common carrier 1 (not illustrated). Furthermore, in a manner spaced apart from the first semiconductor bodies 2 and the second semiconductor bodies 3, a wavelength-converting layer 6 is arranged in the beam path of the first semiconductor bodies 2 and of the second semiconductor bodies 3. In other words, the wavelength-converting layer 6 is disposed downstream of the first semiconductor bodies 2 and the second semiconductor bodies 3 in the emission direction thereof.

In the present case, the wavelength-converting layer 6 is configured as a film. The film comprises a matrix material into which particles of a phosphor 7 are embedded. The phosphor 7 is suitable for converting blue light of the first emission spectrum 4 into red light of the third emission spectrum 9.

By way of example, one of the following materials is suitable as matrix for the film: polycarbonate, silicone, epoxide.

Downstream of the first semiconductor bodies 2 and the second semiconductor bodies 3 in the emission direction thereof, an LCD monitor element 14 is arranged above the wavelength-converting layer 6. In the present case, the LCD monitor element 14 comprises a liquid-crystalline matrix that serves for displaying images.

A filter system 15 comprising red filters 16, a green filters 17 and blue filters 18 is arranged downstream of the LCD monitor element 14 in the emission direction of the semiconductor bodies 2, 3. The blue filters 18, the green filters 17 and the red filters 16 of the color filter system 15 serve to define subpixels of the LCD display.

The entire electromagnetic radiation composed of radiation of the first emission spectrum 4, radiation of the second emission spectrum 10 and radiation of the third emission spectrum 9 and having a total spectrum passes through the color filter system 15.

If the entire electromagnetic radiation having the total spectrum passes through the blue filter 18, then the blue filter 18 filters the light of the total spectrum to form light of a first transmission spectrum 19. The green light of the second semiconductor bodies 3 and the red light of the phosphor 7 are in this case preferably absorbed as completely as possible by the blue filter 18.

If the entire electromagnetic radiation having the total spectrum passes through the green filter 17, then the green filter 17 filters the entire light of the total spectrum to form light of a second transmission spectrum 20. The blue light of the first semiconductor bodies 2 and the red light of the phosphor 7 are in this case preferably absorbed as completely as possible by the green filter 17.

If the red light of the phosphor 7 passes through the red filter 16, then the red filter 16 filters the entire electromagnetic radiation having the total spectrum to form light of a third transmission spectrum 21. The blue light of the first semiconductor bodies 2 and the green light of the second semiconductor bodies 3 are in this case preferably absorbed as completely as possible by the red filter 16.

The first emission spectrum 4, the second emission spectrum 10 and the third emission spectrum 9, which together form the total spectrum, can be embodied in this case for example as already described with reference to FIGS. 1B to 1D.

Figure 7:
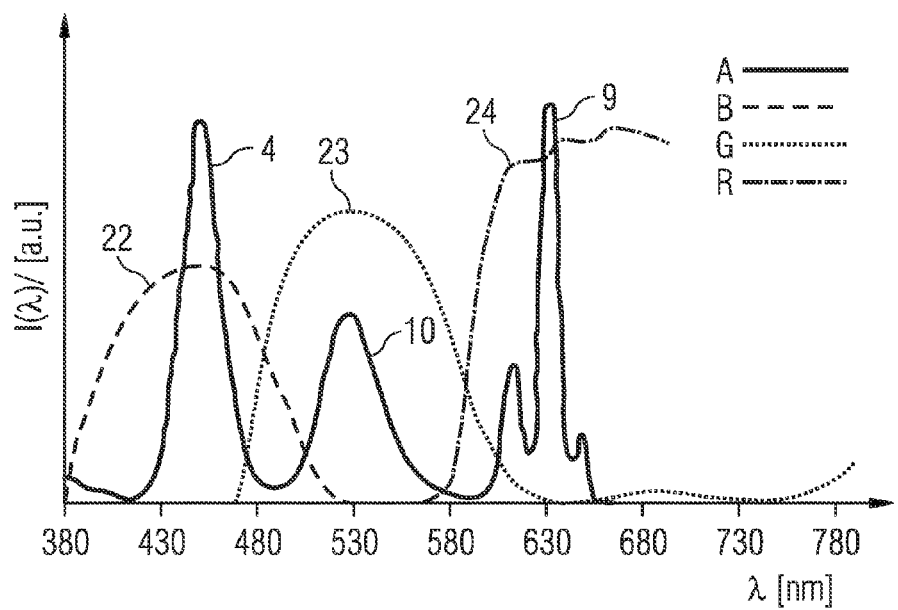
FIG. 7 shows by way of example the emission spectrum of a first semiconductor body, of a second semiconductor body and of a phosphor (curve A, solid line) and the characteristic curves of a red filter (curve R), of a green filter (curve G) and of a blue filter (curve B).

FIG. 7 shows by way of example the first emission spectrum 4 of the first semiconductor bodies 2, the second emission spectrum 10 of the second semiconductor bodies 3 and the third emission spectrum 9 of the phosphor 7, as already described with reference to FIG. 5 (curve A in both figures). The first emission spectrum 4 of the first semiconductor bodies 2, the second emission spectrum 10 of the second semiconductor bodies 3 and the third emission spectrum 9 of the phosphor 7 in this case form a total spectrum. Furthermore, FIG. 7 shows a first characteristic curve 22 of the blue filter 18, a second characteristic curve 23 of the green filter 17 and a third characteristic curve 24 of the red filter 16. The respective characteristic curve 22, 23, 24 in each case reproduces the intensity I of the electromagnetic radiation as a function of the wavelengths λ transmitted by the respective filter 16, 17, 18.

The first characteristic curve 22 of the blue filter 18 (curve B, dashed) reveals that the blue filter 18 is transmissive for light having a wavelength of between approximately 380 nm and approximately 530 nm inclusive. The maximum transmissivity of the blue filter 18 for electromagnetic radiation is at a wavelength of approximately 440 nm.

The second characteristic curve 20 of the green filter 17 (curve G, dotted) shows that the green filter 17 is transmissive for light having wavelengths of between approximately 480 nm and approximately 630 nm inclusive. The maximum transmissivity of the green filter 17 for electromagnetic radiation is at a wavelength of approximately 530 nm.

The third characteristic curve 24 of the red filter 16 (curve R) shows that the red filter 16 starts to become transmissive for light having wavelengths starting from approximately 580 nm. The maximum transmissivity of the red filter 16 for electromagnetic radiation starts at a wavelength of approximately 630 nm.

Figure 8:
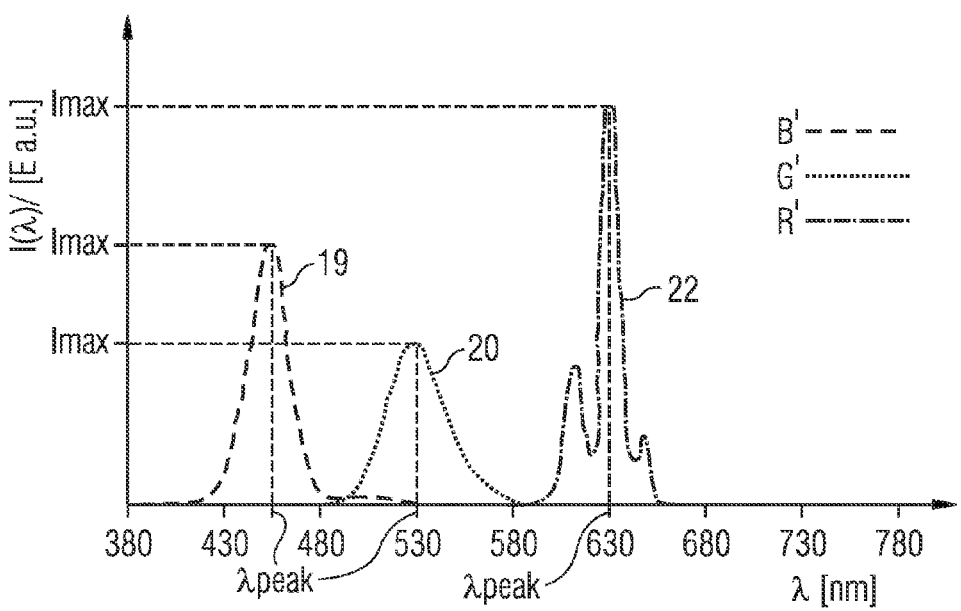
FIG. 8 shows by way of example the transmission spectrum of a red filter (curve R'), of a green filter (curve G') and of a blue filter (curve B').

FIG. 8 finally shows the transmission spectra 19, 20, 21 of the light transmitted by the filters 16, 17, 18 having the characteristic curves 22, 23, 24 in accordance with FIG. 7 upon the passage of light having a total spectrum composed of the emission spectra 4, 9, 10 of the first semiconductor bodies 2, of the second semiconductor bodies 3 and of the phosphor 7, as illustrated in curve A in accordance with FIG. 7.

The first transmission spectrum 19 of the blue filter 18 (curve B') is very similar to the first emission spectrum 4 of the first semiconductor bodies 2. The maximum intensity $I_{max}$ of the peak of the first transmission spectrum 19 is just slightly reduced compared with the maximum intensity $I_{max}$ of the peak of the first emission spectrum 4. The peak wavelength $\lambda_{peak}$ of the first transmission spectrum 19 of the blue filter 18 substantially corresponds to the peak wavelength $\lambda_{peak}$ of the first emission spectrum 4. Likewise, the full width half maximum FWHM of the peak of the first transmission spectrum 19 of the blue filter 18 substantially corresponds to the full width half maximum FWHM of the first emission spectrum 4.

The second transmission spectrum 20 of the green filter 17 (curve G') is also very similar to the second emission spectrum 10 of the second semiconductor bodies 3. The maximum intensity $I_{max}$ of the peak of the second transmission spectrum 20 is just slightly reduced compared with the maximum intensity $I_{max}$ of the peak of the second emission spectrum 10. The peak wavelength $\lambda_{peak}$ of the second transmission spectrum 10 of the green filter 17 substantially corresponds to the peak wavelength $\lambda_{peak}$ of the second emission spectrum 10. The full width half maximum FWHM of the peak of the second transmission spectrum 20 of the green filter 17 likewise substantially corresponds to the full width half maximum FWHM of the second emission spectrum 10.

Likewise, the third transmission spectrum 21 of the red filter 16 (curve R') is very similar to the third emission spectrum 9 of the phosphor 7. The maximum intensity $I_{max}$ of the peak of the third transmission spectrum 22 is just slightly reduced compared with the maximum intensity $I_{max}$ of the peak of the third emission spectrum 9. The peak wavelength $\lambda_{peak}$ of the third transmission spectrum 21 of the red filter 16 substantially corresponds to the peak wavelength $\lambda_{peak}$ of the third emission spectrum 9. The full width half maximum FWHM of the peak of the third transmission spectrum 21 of the red filter 16 likewise substantially corresponds to the full width half maximum FWHM of the third emission spectrum 9.

Figure 9:
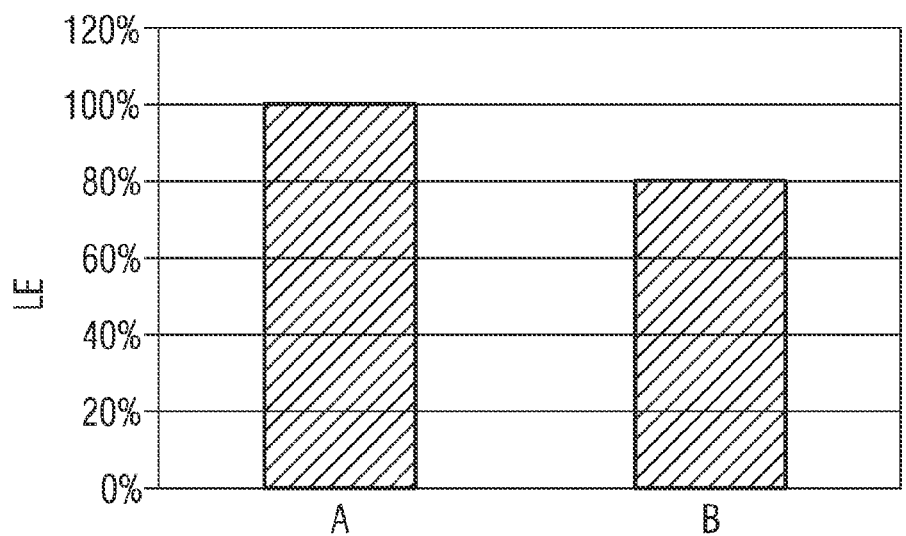
FIG. 9 shows by way of example the relative luminous efficiency LE of a conventional lighting device (bar B) having the total spectrum in accordance with curve B from FIG. 5 and the relative luminous efficiency LE of a lighting device in accordance with one exemplary embodiment (bar A) having the total spectrum in accordance with curve A from FIG. 5.

Bar A in FIG. 9 shows the luminous efficiency LE of a lighting device in accordance with one exemplary embodiment having the total spectrum in accordance with curve A from FIG. 5. For comparison purposes, FIG. 9 furthermore illustrates the luminous efficiency LE of a conventional lighting device having a total spectrum in accordance with curve B from FIG. 5. Accordingly, the luminous efficiency LE of a conventional lighting device is only approximately 80% of the luminous efficiency LE of a lighting device in accordance with one exemplary embodiment. The luminous efficiency LE that can be obtained with a present lighting device is therefore at least greater by 18% than that of a conventional lighting device.

Figure 10:
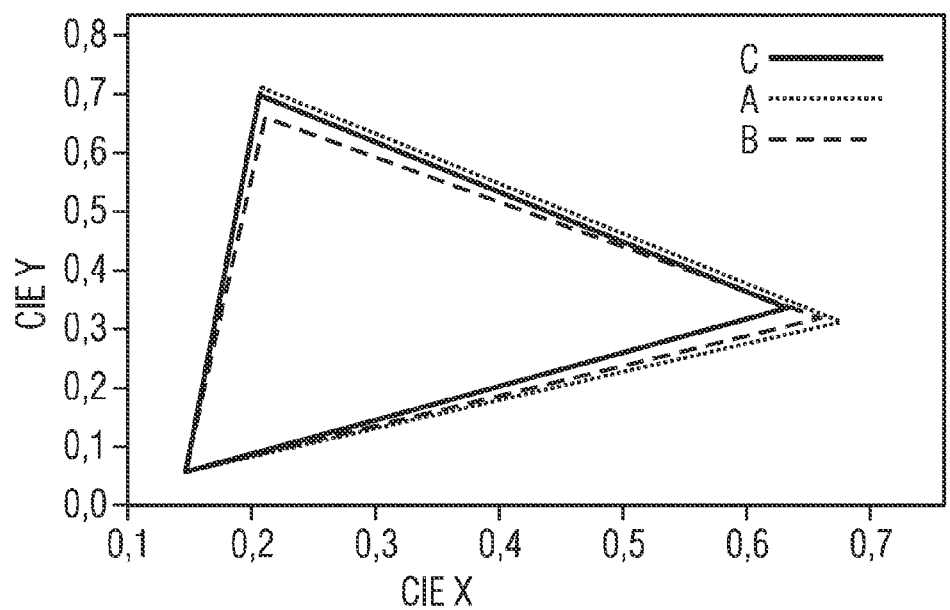
FIG. 10 shows in each case schematically the color triangle (curve A, dotted line) spanned by the light of a display having the transmission spectra in accordance with the curves B', G' and R' from FIG. 8, the color triangle (curve B, dashed line) spanned by the light of a conventional display, and the Adobe RGB color triangle (curve C, solid line).

FIG. 10 shows the color triangle (curve A, dotted line) spanned by means of the transmission spectra in accordance with FIG. 8, the color triangle (curve B, dashed line) spanned by means of a conventional lighting device in conjunction with a color filter system 15, and the abode RGB standard triangle (curve C, solid line).

The color triangle spanned by means of the total spectrum of a conventional lighting device in conjunction with a filter system 15 does not completely fill the Adobe RGB standard triangle. In general, the color triangle corresponding to the conventional lighting device only has a degree of overlap with the Adobe RGB standard triangle of between 94.5% and 99%.

FIG. 10 furthermore illustrates the color triangle spanned by means of the transmission spectra 19, 20, 21 in accordance with one exemplary embodiment, for example in accordance with FIG. 8. As shown in FIG. 10, such a color triangle has a degree of overlap with the Adobe RGB standard triangle that is at least 99.5%.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A lighting device comprising:
    a first semiconductor body, which has an active zone that generates blue light having a first emission spectrum during operation;
    a second semiconductor body, which has an active zone that generates green light having a second emission spectrum during operation; and
    a phosphor suitable for converting blue light of the first semiconductor body partly into red light having a third emission spectrum, wherein the third emission spectrum has a peak in the red spectral range that has an average full width half maximum of not greater than 25 nm, and
    wherein the phosphor is $CaWO_4:Eu^{3+}$ or $Gd_2(MoO_4)_3$: $Sm^{3+}$.

2. The lighting device according to claim 1, wherein a peak of the first emission spectrum of the blue light has an average full width half maximum that is not greater than 30 nm.

3. The lighting device according to claim 1, wherein a peak of the first emission spectrum of the blue light of the first semiconductor body has a peak wavelength of between 435 nm and 460 nm inclusive.

4. The lighting device according to claim 1, wherein a peak of the second emission spectrum of the green light has an average full width half maximum that is not greater than 40 nm.

5. The lighting device according to claim 1, wherein a peak of the second emission spectrum of the green light has a peak wavelength of between 515 nm and 560 nm inclusive.

6. The lighting device according to claim 1, wherein the peak of the third emission spectrum of the red light has a peak wavelength of between 595 nm and 650 nm inclusive.

7. The lighting device according to claim 1, wherein the first semiconductor body and the second semiconductor body are arranged in a common housing or on a common carrier.

8. The lighting device according to claim 1, wherein the first semiconductor body and the second semiconductor body are arranged in two separate housings or on two separate carriers.

9. The lighting device according to claim 1, wherein the phosphor is applied in a wavelength-converting layer on a radiation exit surface of the first semiconductor body.

10. The lighting device according to claim 1, wherein the phosphor is arranged in a manner spaced apart from the semiconductor bodies.

11. The lighting device according to claim 1, further comprising:
    a component housing, wherein the first semiconductor body and the second semiconductor body are arranged in a cutout of the component housing; and
    a potting in the cutout, wherein the potting has particles of the phosphor introduced therein.

12. A backlighting device for a display or a television comprising the lighting device according to claim 1.

13. A display or television comprising:
    a lighting device according to claim 1;

a color filter system comprising a blue filter, configured to filter the light of a total spectrum comprising the first emission spectrum, the second emission spectrum and the third emission spectrum to form light of a first transmission spectrum;

a green filter, which filters the light of the total spectrum to form light of a second transmission spectrum; and a red filter, which filters the light of the total spectrum to form light of a third transmission spectrum.

14. The display or television according to claim 13, wherein a point corresponding to a color impression of the first transmission spectrum in a CIE chromaticity diagram, a point corresponding to the color impression of the second transmission spectrum in the CIE chromaticity diagram and a point corresponding to the color impression of the third transmission spectrum in the CIE chromaticity diagram span a color triangle within a CIE standard diagram that has a degree of overlap of at least 99.5% with an Adobe RGB color triangle.

* * * * *